United States Patent
Ouacha et al.

(10) Patent No.: US 7,880,559 B2
(45) Date of Patent: Feb. 1, 2011

(54) PROGRAMMABLE MICROWAVE CIRCUIT

(75) Inventors: Aziz Ouacha, Åtvidaberg (SE); Carl Samuelsson, Linköping (SE)

(73) Assignee: Total Forsvarets Forskningsinstitut, Stockhom (SE)

( * ) Notice: Subject to any disclaimer, the term of this patent is extended or adjusted under 35 U.S.C. 154(b) by 315 days.

(21) Appl. No.: 11/887,931

(22) PCT Filed: Apr. 5, 2006

(86) PCT No.: PCT/SE2006/000408

§ 371 (c)(1), (2), (4) Date: Jan. 23, 2009

(87) PCT Pub. No.: WO2006/107261

PCT Pub. Date: Oct. 12, 2006

(65) Prior Publication Data

US 2009/0295513 A1    Dec. 3, 2009

(30) Foreign Application Priority Data

Apr. 5, 2005   (SE) .................................. 0500746

(51) Int. Cl.
*H01P 1/10* (2006.01)
*H03H 11/02* (2006.01)
(52) U.S. Cl. ...................... 333/101; 333/125
(58) Field of Classification Search ............ 333/101, 333/103, 104, 125, 136
See application file for complete search history.

(56) References Cited

U.S. PATENT DOCUMENTS

| 5,150,083 | A |   | 9/1992  | Chen et al. |
| 6,049,252 | A | * | 4/2000  | Iwata ........................ 330/254 |
| 7,145,386 | B2 | * | 12/2006 | Wagner ..................... 330/69 |
| 7,675,385 | B1 | * | 3/2010  | Mulbrook et al. ........... 333/124 |

FOREIGN PATENT DOCUMENTS

| GB | 2 301 947 A | 12/1996 |
| WO | WO 02/41442 A1 | 5/2002 |

OTHER PUBLICATIONS

Kim, et al., "Reconfigurable Power Divider and Combiner with Variable Power Ratio," IEEE MTT-S Digest, vol. 1, pp. 57-60, 2004 (Abstract only).

* cited by examiner

*Primary Examiner*—Dean O Takaoka
(74) *Attorney, Agent, or Firm*—Jacobson Holman PLLC (57) ABSTRACT

The present invention relates to a programmable microwave circuit (1) four ports (3), and combinations of such circuits. Between each pair of ports there is at least one connection without amplification, at least one connection having amplification from a first port of the pair of ports to a second port of the pair of ports, and at least one connection having amplification from the second port to the first port. Further, there is control electronics (2) with the ability to open and close the respective connection and respective port, by which the microwave circuit could be configured for different purposes, such as amplifier, power splitter/power combiner and router.

5 Claims, 9 Drawing Sheets

PROGRAMMABLE MICROWAVE CIRCUIT

This is a national stage of PCT/SE2006/000408 filed Apr. 5, 2006, and published in English.

The present invention relates to a programmable microwave circuit, here named PROMFA, PROgrammable Microwave Function Array, and combinations of such circuits. These can be useful in several different applications. PROMFA has come from a microwave circuit for use in a sensor system in the microwave range, the principle of the invention can, however, be used in other applications, such as in distribution networks for the antenna elements of an array antenna having analog beam forming and in other cases. It is the explicit intention of the applicant that the present patent shall concern a programmable microwave circuit regardless of its field of application.

Today's sensors and especially microwave sensors are designed and built for a specific scenario and optimised for a certain application. This conventional way of designing microwave circuits limits their possibility to adapt to new demands and as a consequence their functionality in a sensor system is limited.

Tomorrow's network based defence calls for mobile and flexible network nodes, in which sensors are located. A crucial factor for an effective and robust network will be access to safe communication channels, reliable sensor data and the possibility to dynamically modify the roles of individual nodes in the network. One way of making this possible is to develop reconfigurable, and in certain respects completely new, RF front ends, having the ability in real time to adapt, controlled by software, to new tasks, and thereby optimising themselves to the posed operational demands. Such ability requires new classes of circuit and system architecture easily adaptable and having multifunctional characteristics.

The present invention provides a solution to the problem of making a programmable and reconfigurable microwave circuit by the invention being designed in the way that is evident from the following independent claims. The remaining claims define advantageous embodiments of the invention.

The invention will now be described in more detail with reference to the accompanying drawing, in which.

The basic idea of the invention is that different functions are realized by solely using a general generic analog basic cell of multi-port type, which can be controlled so as to get different characteristics. An array of such cells can dynamically reconfigure itself, either collectively according to a plan drawn up in advance or in a way momentarily needed to carry out a certain assignment.

Figure 1:
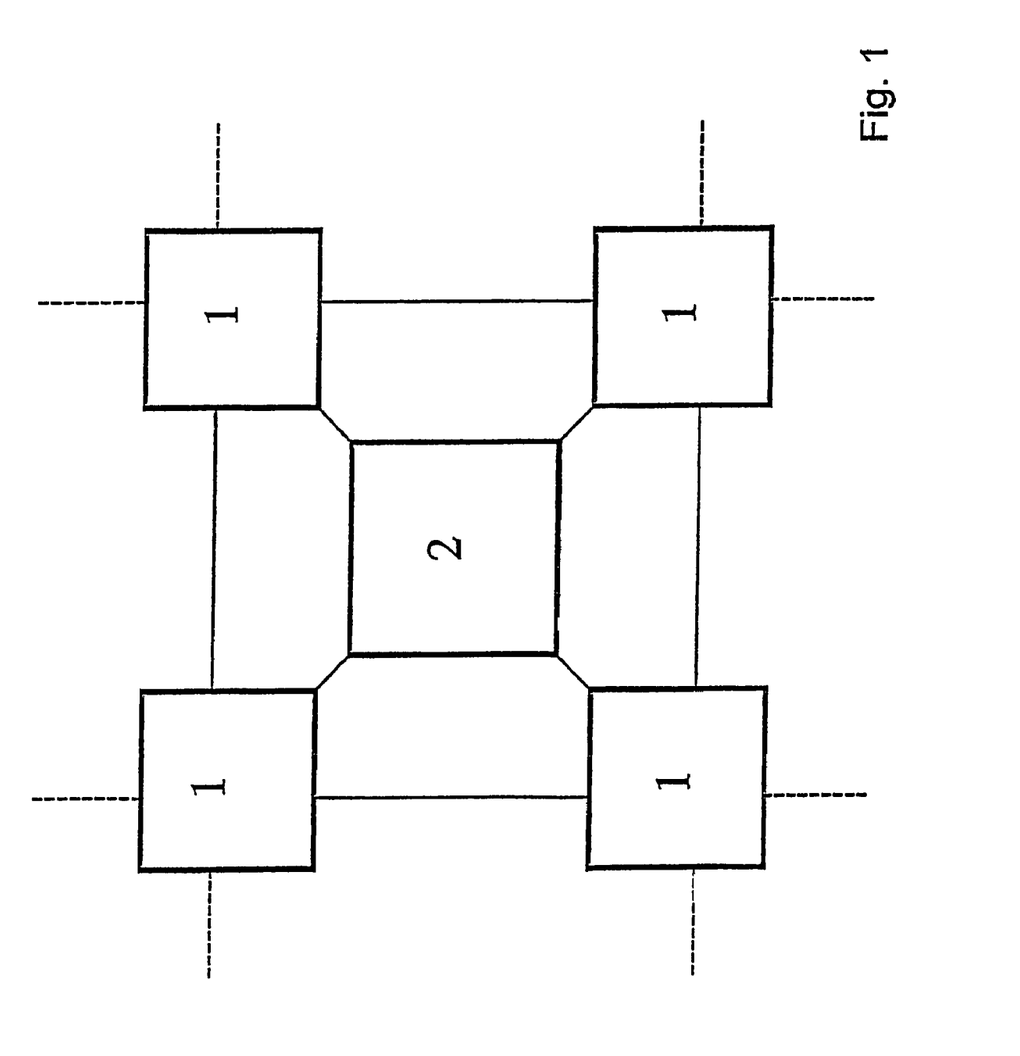
FIG. 1 shows four interconnected basic cells according to the invention that are controlled by digital logic.

In FIG. 1 is shown how four interconnected basic cells 1 are controlled by digital logic 2. The four basic cells can generate several different functions, e.g. as an amplifier, a power splitter, a power combiner and a router. Interconnected cells can create more complex functions, e.g. filters.

The basic PROMFA cell is designed as a 4-port. This makes it easy to connect several cells to a larger array. By biasing the circuit in different ways the signal route to be used is chosen, and depending on the signal route chosen the cell can be either amplifying, routing, monodirectional or bidirectional. The number of active ports is chosen depending on the desired function.

Figure 2:
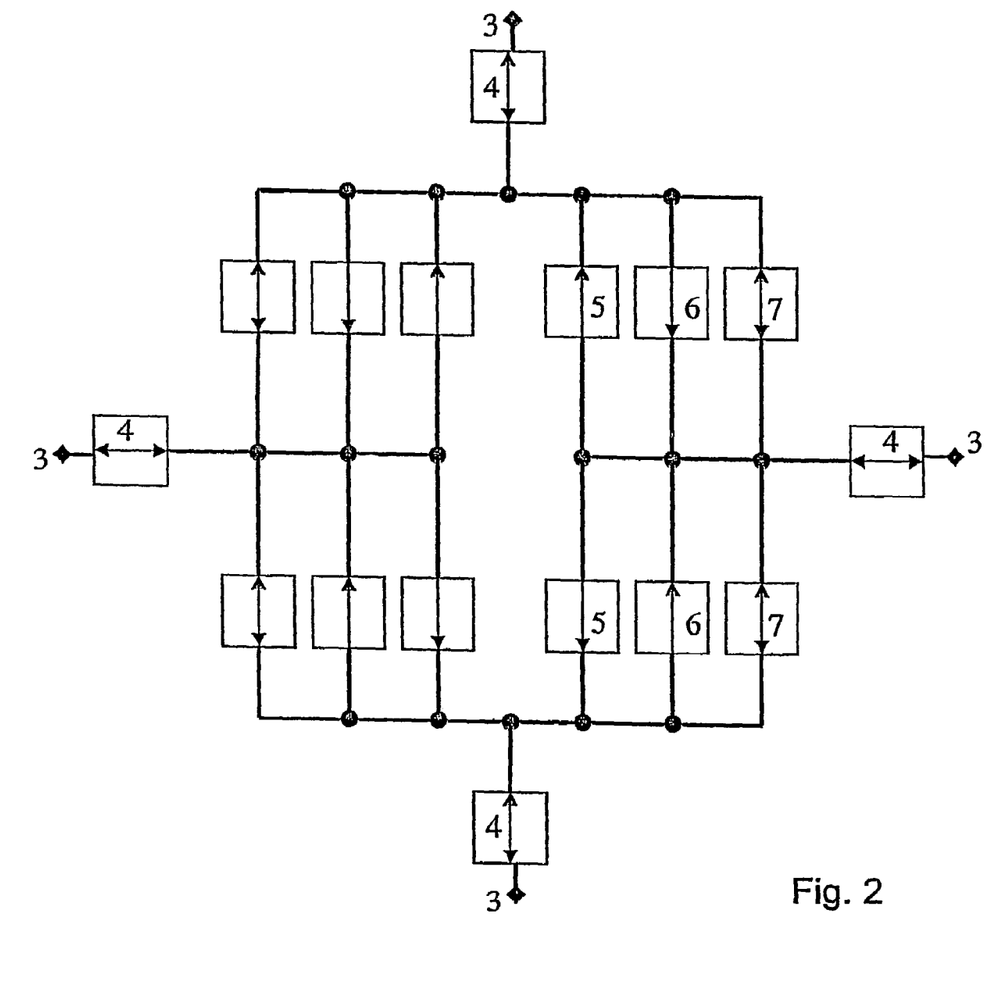
FIG. 2 shows the principal design of a basic cell.

In FIG. 2 the principal design of a basic cell is shown. The ports are denominated 3. After each port follows an input stage—a switch—4 so that the ports can be activated or deactivated. The ports 3 must be interconnectable. This is done by bidirectional amplifying stages, which, as in the Figure, can take the form of two parallel opposite directed monodirectional amplifying stages 5 and 6. In order to be able to passively interconnect ports, there is a demand for a connection with a switch 7 between the ports. In this way ports can be interconnected without amplification, which is required in order to route signals and generate time delays necessary in certain applications. Depending on the, by means of the switches 7, chosen signal route between two ports, a cell can have different time delay.

Figure 3:
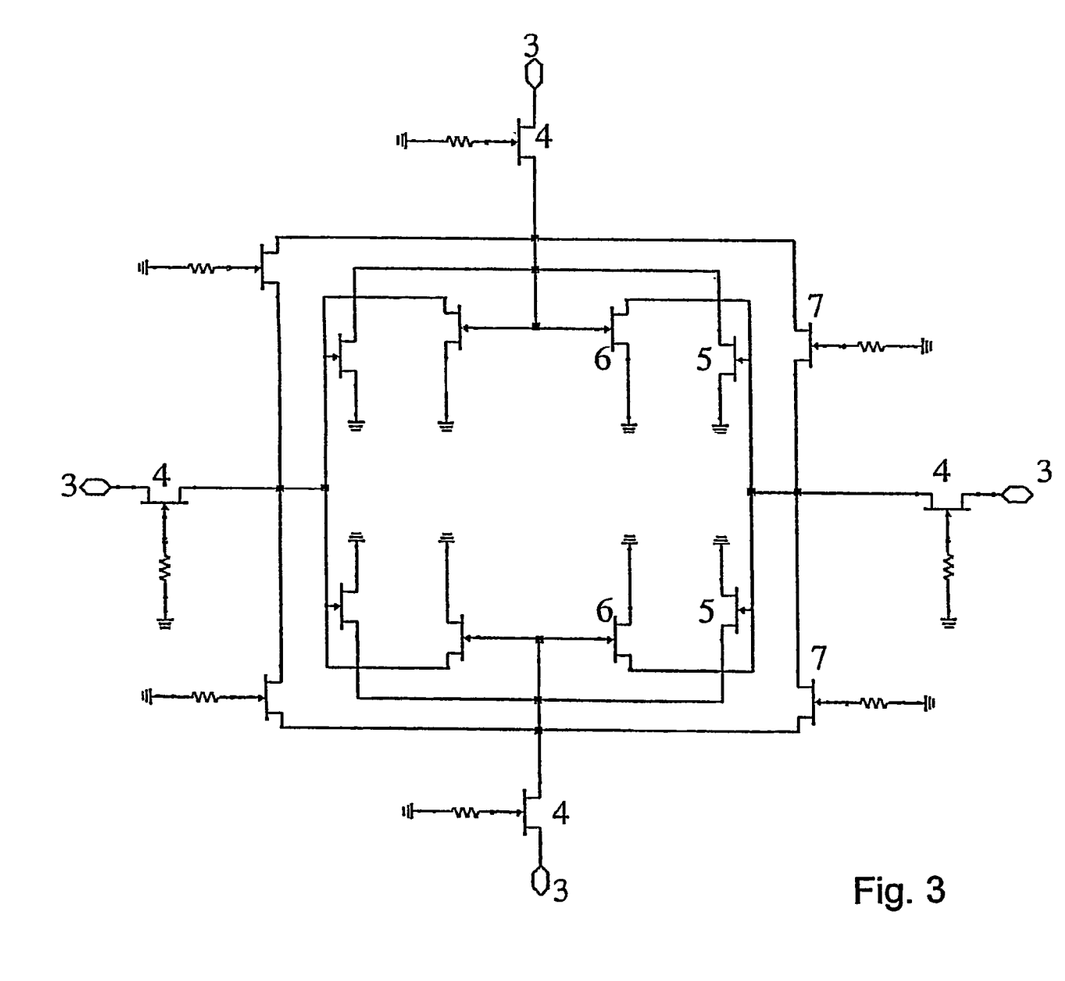
FIG. 3 shows how the basic cell according to FIG. 2 can be implemented with transistors as amplifying elements and switches.

In FIG. 3 it is shown how the basic cell can be implemented with transistors as amplifying elements and switches. The transistors are in a known way connected by transmission lines. The direction for the amplification between two ports is chosen by biasing the transistors 5 and 6 forming the amplifying elements. The biasing is carried out in a known way by means of resistors and coils, and has for the sake of lucidity not been drawn in the Figures. In the same way, the biasing of a transistor forming a switch 4 or 7 will control if the transistor is conducting or not. In order to achieve a higher degree of linearity or to cover a bigger frequency range each drawn transistor could be replaced by arrays of transistors, from which the most suitable transistor is chosen for each application.

Figure 4:
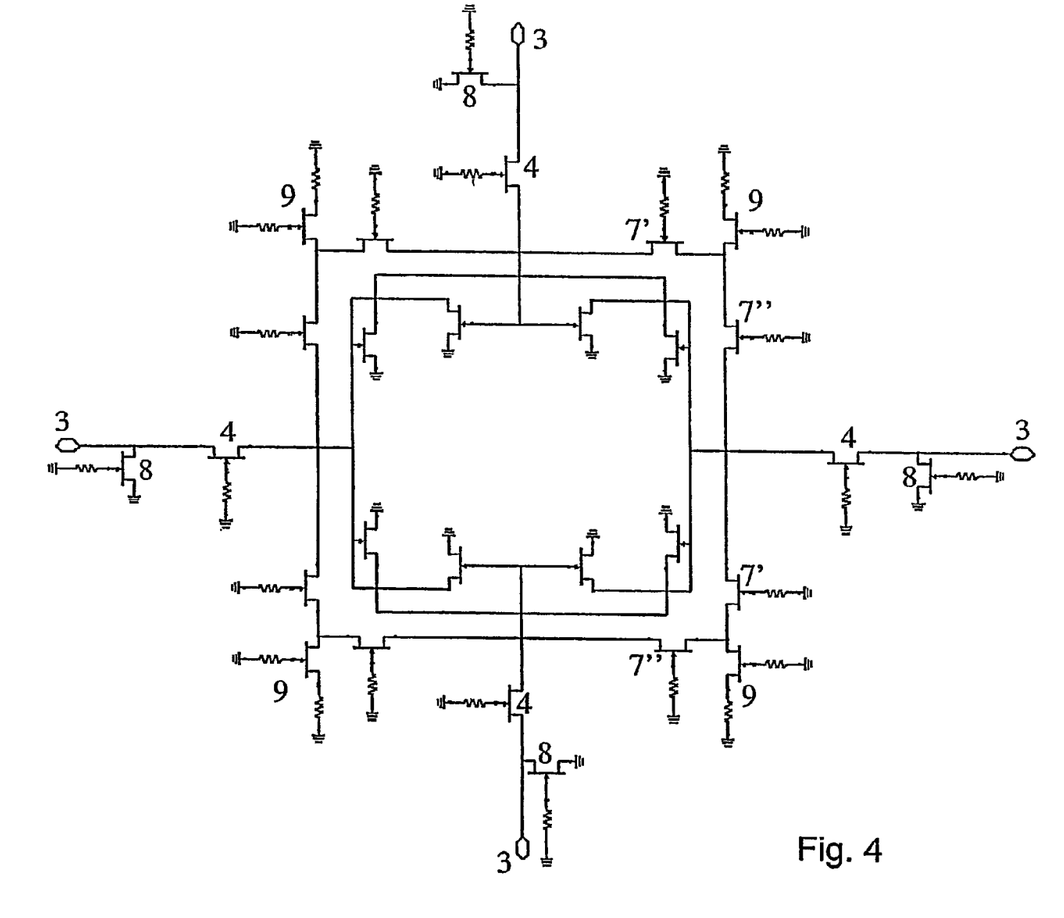
FIG. 4 shows the cell in FIG. 2 supplemented by elements for terminating unwanted signals.

In order to avoid reflection of signals in the cell, it could be suitable to connect elements that allow a signal to be terminated. In FIG. 4 an example of this is shown where the transistors 8 terminate signals on the deactivated ports and the transistors 9 terminate signals in the passive connection between adjacent ports. In the latter case, two pass transistors, 7' and 7", are preferably used, one on each side of the termination 9, so the cell becomes completely symmetrical, which leads to symmetrical characteristics between all ports 4.

By biasing the participating transistors in different ways PROMFA can be configured for a number of functions, of which amplifier, power splitter/power combiner and router is shown in the following.

Figure 5:
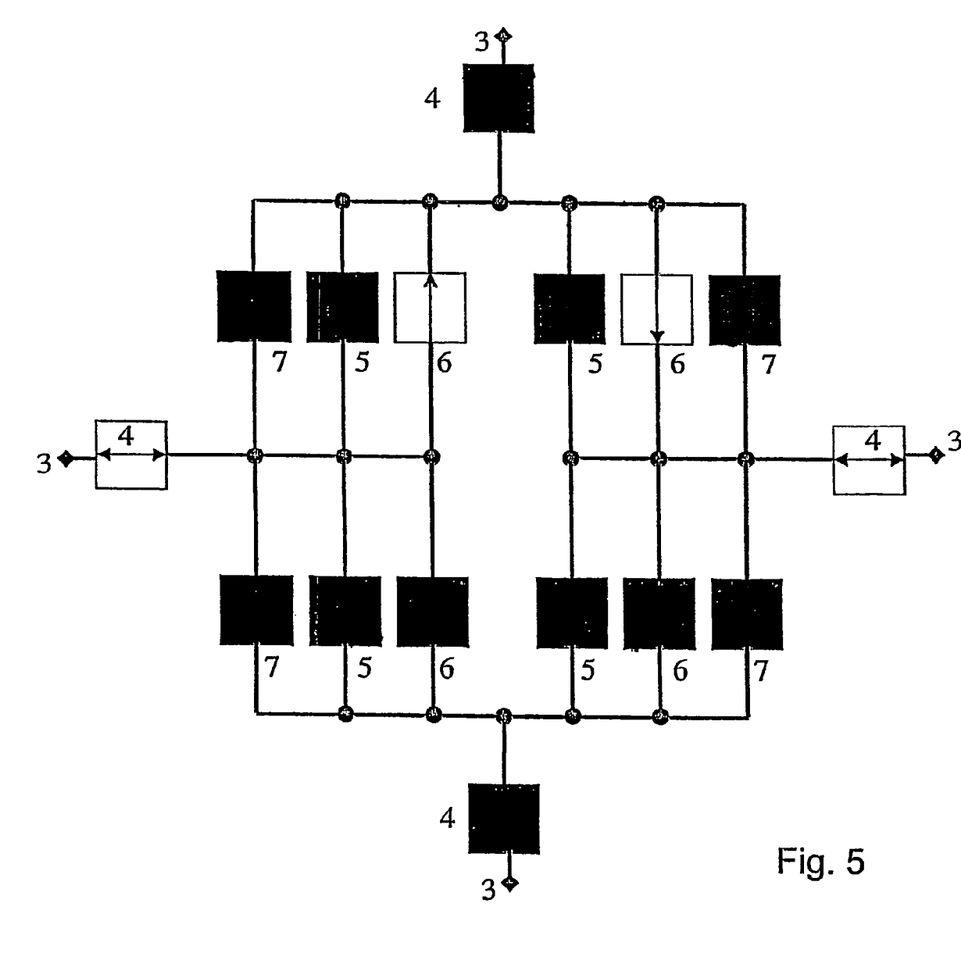
FIG. 5 shows in a principle way a basic cell configured as an amplifier having two stages.

As a 2-port amplifier the circuit can be controlled both with respect to amplification and frequency range. The amplification takes place in the amplification elements 5 and 6. The amount of amplification is controlled by connecting one or more stages, and, where appropriate, by which and how many of the transistors in the transistor arrays that are connected. In the same way, the frequency range, within which the amplifier should work, is controlled. In FIG. 5 an example having two amplifying elements in series is shown. The black blocks represent deactivated stages.

Figure 6A:
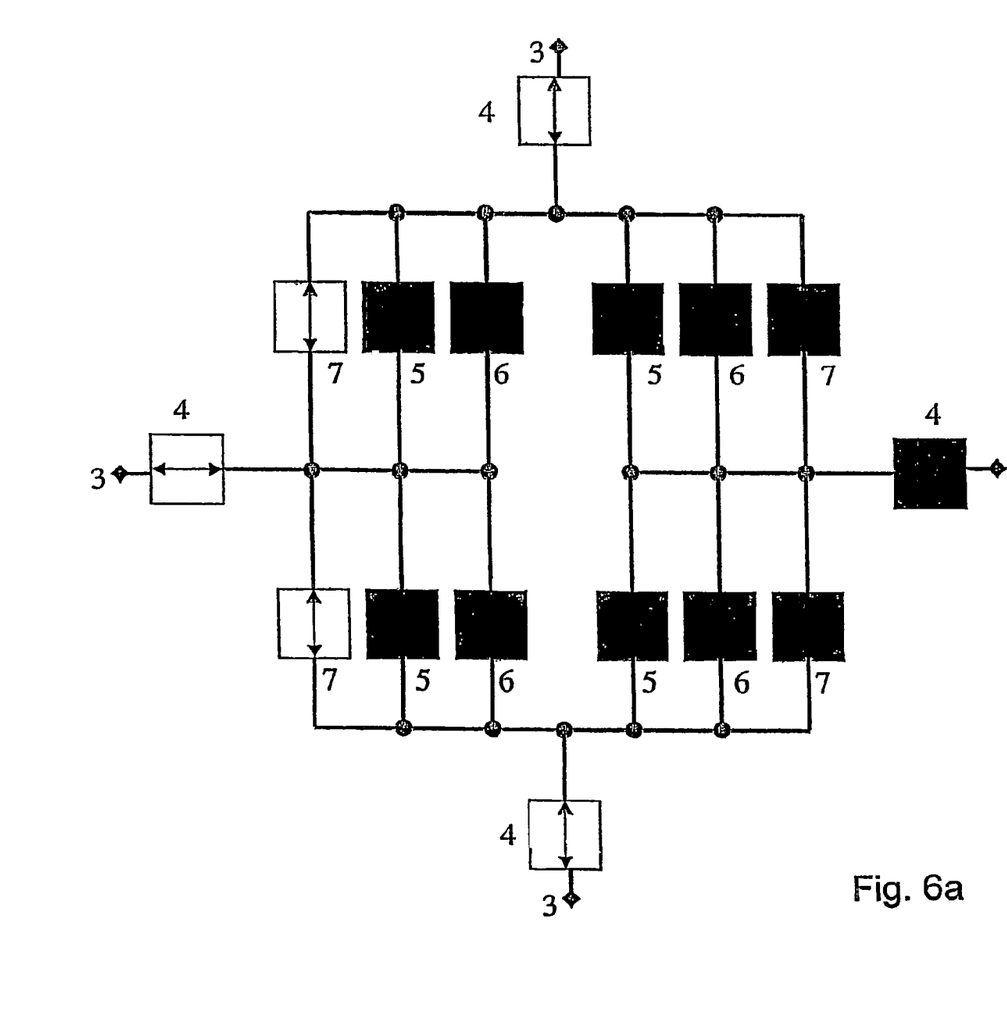
FIG. 6a shows in a principle way a basic cell configured as a passive power splitter/power combiner.
Figure 6B:
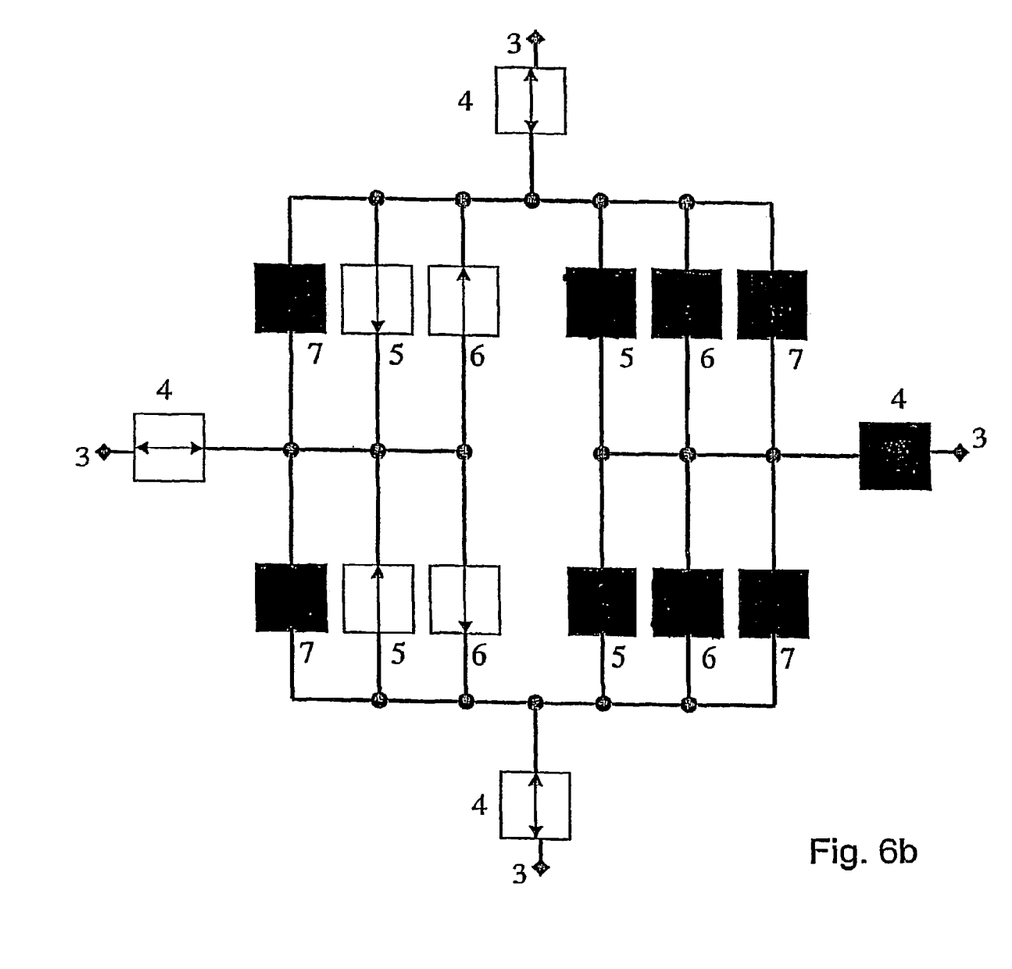
FIG. 6b shows in a principle way a basic cell configured as an amplifying power splitter/power combiner.

As power splitter/power combiner the circuit can be amplifying or just be routing. A passive power splitter or power combiner is shown in FIG. 6a. In this case, the pass transistors 7 between three ports 3 are activated at the same time as the other signal routes are closed. In FIG. 6b the same case with amplification is shown. Depending on if the circuit should be a power splitter or a power combiner, the amplifying stages are activated in one or the other of the directions indicated in the Figure, the amplifying elements 5 or 6.

Figure 7:
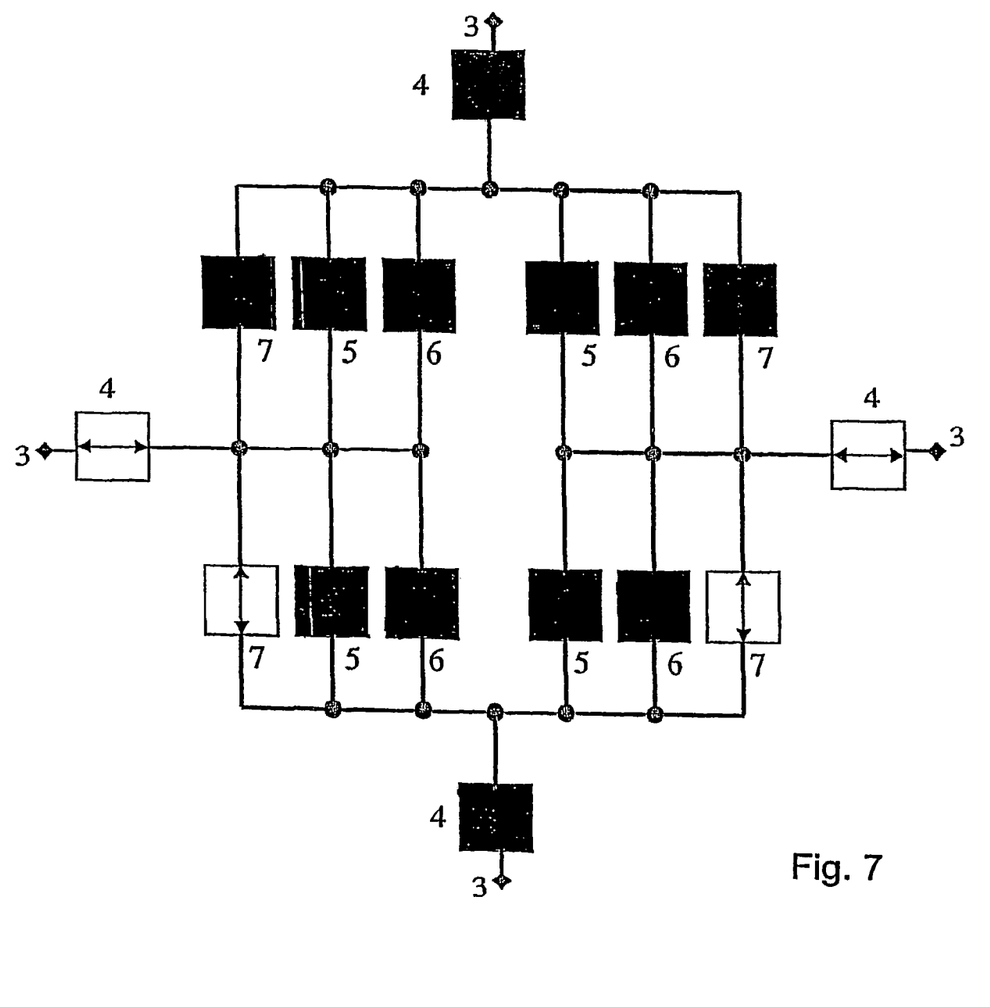
FIG. 7 shows in a principle way a basic cell configured as a router.

As a router, cf. FIG. 7, the circuit is configured so as to receive and send signals bidirectionally. For this purpose the pass transistors 7 are used. The router function can be used, besides to route signals, also to create time shifts or phase shifts for the signal.

Figure 8:
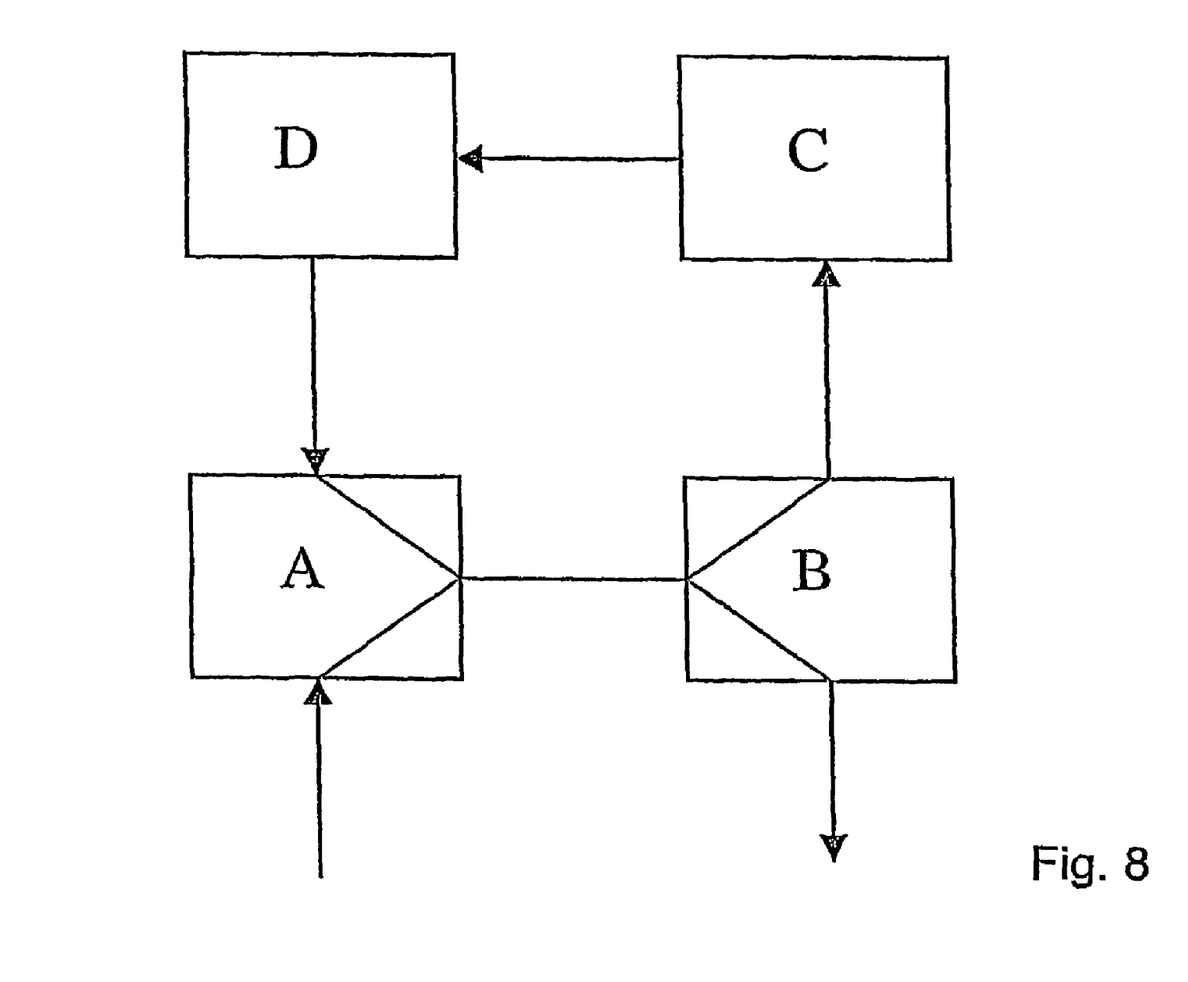
FIG. 8 shows four interconnected basic cells forming an active filter.

An active filter is an application that can be created by an array of PROMFA cells. An example of this is shown in FIG. 8. Here four PROMFA cells are used, cell A as a power combiner, cell B as a power splitter and cells C and D as routers to create a time delay. The number of routers could of course be varied from one to a larger number in order to give the desired time delay. By controlling the time delay in the feedback, the centre frequency of the filter can be controlled. As there is a demand for some amplification in the loop, the amplification elements of the power splitter and power combiner are used.

When designing a concrete embodiment of the invention, a GaAs process, ed02ah, from the semiconductor manufacturer OMMIC could be used. The length of the transmission lines between the transistors is not critical for the functioning.

An example of a microwave circuit that can be used in the X band (8-12 GHz) has been calculated by means of this GaAs process, at which the transistors had a gate length of 0.2 µm. As the cell is symmetrical, several of the transistors are of the same size. All amplifying elements 5 and 6 are of the same size. Also, all input transistors are of another, but among themselves equal size. The same goes for the pass transistors. The transistors terminating signals on deactivated ports and between pass transistors are in the same way of the same size group-by-group, but different between the groups and different to the previously mentioned groups.

In the mentioned example the transistors were calculated as follows:

| | |
|---|---|
| The amplifying transistors | 4 gate fingers having the gate width 36 µm, |
| The input transistors | 4 gate fingers having the gate width 47 µm, |
| The pass transistors | 2 gate fingers having the gate width 15 µm, |
| The transistors for terminating in a passive connection and | 2 gate fingers having the gate width 50 µm |
| The transistors for terminating on the inputs | 2 gate fingers having the gate width 40 µm. |

The invention claimed is:

1. A reconfigurable microwave circuit having four ports (3), characterised in that there is between each pair of ports at least one connection without amplification, at least one connection having amplification from a first port of the pair of ports to a second port of the pair of ports and at least one connection having amplification from the second port to the first port, and that there is control electronics (2) with the ability to open and close the respective connection and respective port, by which the microwave circuit could be configured for different purposes, such as amplifier, power splitter/power combiner and router.

2. A reconfigurable microwave circuit as claimed in claim 1, characterised in that one or more transistors are utilized as input stage—switch—(4) directly after the respective port in order to open and close the port depending on its biasing, that one or more transistors are utilized as amplifying element (5,6) that are used, depending on the biasing, to amplify a signal in the respective connection having amplification or to close the connection for the signal, and that one or more transistors are utilized as switch (7) in order to open and close the respective connection without amplification depending on its biasing.

3. A combined microwave circuit comprising at least two interconnected reconfigurable microwave circuits as claimed in claim 1.

4. A combined microwave circuit as claimed in claim 3, characterised in that it is an active filter by being made of at least three reconfigurable microwave circuits, at which the first (A) is a power combiner having amplification, a first input of which being an input of the filter, and an output of which leads to a second reconfigurable microwave circuit (B) that is a power splitter having amplification, a first output of which being an output of the filter, and a second output of which leading to an input of a third reconfigurable microwave circuit (C) that is a router with a certain amount of time delay, this reconfigurable microwave circuit in the form of a router could be followed by none, one or several similar routers (D) in order to increase the time delay, finally an output of the last router is connected to a second input of said first reconfigurable microwave circuit (A), i.e. the power combiner, which creates a loop for a input signal.

5. A combined microwave circuit comprising at least two interconnected reconfigurable microwave circuits as claimed in claim 2.

* * * * *